(12) United States Patent
Cho (10) Patent No.: US 8,284,604 B2
(45) Date of Patent: Oct. 9, 2012

(54) NOR FLASH MEMORY DEVICE AND RELATED METHODS OF OPERATION

(75) Inventor: Ji ho Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 309 days.

(21) Appl. No.: 12/719,188

(22) Filed: Mar. 8, 2010

(65) Prior Publication Data

US 2010/0238739 A1  Sep. 23, 2010

(30) Foreign Application Priority Data

Mar. 20, 2009  (KR) .................. 10-2009-0023996

(51) Int. Cl.
*G11C 16/04* (2006.01)

(52) U.S. Cl. ......... 365/185.13; 365/185.33; 365/185.18; 365/185.29

(58) Field of Classification Search ............. 365/185.33, 365/185.13, 185.18, 185.29, 185.28
See application file for complete search history.

(56) References Cited

U.S. PATENT DOCUMENTS

| | | | |
|---|---|---|---|
| 6,504,765 B1 * | 1/2003 | Joo | 365/185.29 |
| 6,842,378 B2 * | 1/2005 | Chang | 365/185.22 |
| 7,142,460 B2 | 11/2006 | Lee et al. | |
| 7,889,568 B2 * | 2/2011 | Watanabe | 365/185.23 |

FOREIGN PATENT DOCUMENTS

| | | |
|---|---|---|
| JP | 2006252749 A | 9/2006 |
| KR | 1020040004895 A | 1/2004 |
| KR | 100600951 B1 | 7/2006 |
| KR | 100612569 B1 | 8/2006 |

* cited by examiner

*Primary Examiner* — David Lam
(74) *Attorney, Agent, or Firm* — Volentine & Whitt, PLLC (57) ABSTRACT

A NOR flash memory device is programmed by selecting one of a plurality of global bit lines and sequentially selecting a plurality of local bit lines commonly connected with the selected global bit line to supply a program voltage to memory cells.

12 Claims, 7 Drawing Sheets

NOR FLASH MEMORY DEVICE AND RELATED METHODS OF OPERATION

STATEMENT OF RELATED APPLICATIONS

This application claims priority under 35 U.S.C §119 to Korean Patent Application No. 10-2009-0023996 filed Mar. 20, 2009, the disclosure of which is hereby incorporated by reference in its entirety.

BACKGROUND

Embodiments of the inventive concept relate generally to semiconductor memory devices, and more particularly to NOR flash memory devices and related methods of operation.

Semiconductor memory devices are a major component of many modern electronic devices. Examples of semiconductor memory devices include volatile memories, such as dynamic random access memory (DRAM) and static random access memory (SRAM), as well as nonvolatile memories, such as read only memory (ROM), magnetoresistive random access memory (MRAM), and flash memory.

Flash memory has gained increasing popularity in recent years due at least to the propagation of portable electronic devices requiring nonvolatile data storage or kinetic shock resistance. There are two major categories of flash memory with varied configurations and operating principles, known as NAND flash memory and NOR flash memory. NAND flash memories tend to have greater integration density and faster erase and write times compared with NOR flash memories, while NOR flash memories tend to have faster read times.

Because of their different performance characteristics NAND and NOR flash memories may be used for different purposes. For instance, NOR flash memory is commonly used to store information requiring fast access, such as program code due to its fast read time, while NAND is commonly used to provide mass data storage due to its high integration density.

SUMMARY

According to one embodiment of the inventive concept, a method of operating a NOR flash memory device comprises selecting one of a plurality of global bit lines, and selecting a plurality of local bit lines commonly connected with the selected global bit line in a predetermined sequence to supply a program voltage to memory cells of the NOR flash memory device.

In certain embodiments, the program voltage is applied to the memory cells via the selected global and local bit lines in a pre-program operation or a post-program operation of an erase process. The erase process may be performed after the pre-program operation or before the post-program operation.

In certain embodiments, the program voltage is supplied to the memory cells to prevent the memory cells from being over-erased by an erase operation.

According to another embodiment of the inventive concept, a method of erasing a NOR flash memory device comprises performing an erase operation, and performing a program operation before or after the erase operation. The program operation comprises selecting one of a plurality of global bit lines, and selecting a plurality of local bit lines commonly connected with the selected global bit line in a predetermined sequence to supply a program voltage to memory cells.

In certain embodiments, the program operation is a pre-program operation executed before the erase operation or a post-program operation executed after the erase operation.

In certain embodiments, the program operation prevents the memory cells from being over-erased.

According to another embodiment of the inventive concept, a NOR flash memory device comprises a memory cell array comprising local bit lines and global bit lines, a bit line selection circuit configured to select the local bit lines and the global bit lines in response to local and global bit line selection signals, and a decoder configured to generate the local and global bit line selection signals to select local bit lines in a predetermined sequence during an activation of a global bit line in a pre-program or post-program operation.

In certain embodiments, the NOR flash memory device further comprises a read/write circuit configured to supply a program voltage to memory cells via the selected global and local bit lines.

In certain embodiments, the decoder comprises a first bit line decoder configured to generate the global and local bit line selection signals such that one of the global bit lines is selected and local bit lines connected with the selected global bit line are selected sequentially, a second bit line decoder configured to generate the global and local bit line selection signals such that one of local bit lines is selected and a global bit line corresponding to the selected local bit line is selected, and a selection circuit configured to select one of the first bit line decoder and the second bit line decoder.

In certain embodiments, the first bit line decoder is enabled when an erase command is applied to the NOR flash memory device, and the second bit line decoder is enabled when a normal program command is applied to the NOR flash memory device.

In certain embodiments, the first bit line decoder is enabled when one of a pre-program operation and a post-program operation is executed, and the selection circuit selects the first bit line decoder.

BRIEF DESCRIPTION OF THE DRAWINGS

Embodiments of the inventive concept will be more clearly understood from the following detailed description taken in conjunction with the accompanying drawings. In the drawings, like reference numbers denote like features.

DETAILED DESCRIPTION OF THE EMBODIMENTS

Various embodiments will be described more fully hereinafter with reference to the accompanying drawings. The inventive concept may, however, be embodied in many different forms and should not be construed as being limited to only the illustrated embodiments. Rather, these embodiments are presented as teaching examples.

Figure 1:
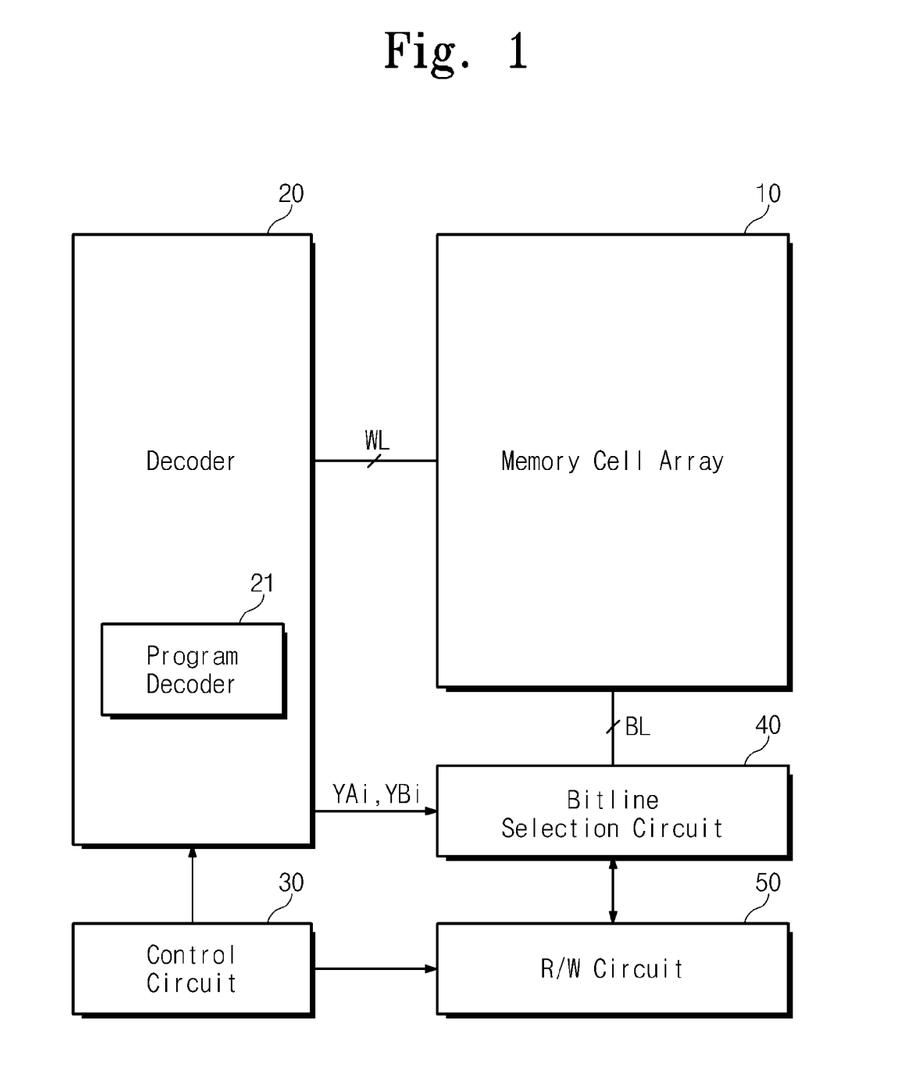
FIG. 1 is a block diagram illustrating a NOR flash memory device according to an embodiment of the inventive concept.

FIG. 1 is a block diagram illustrating a NOR flash memory device according to an embodiment of the inventive concept.

Referring to FIG. 1, the NOR flash memory device comprises a memory cell array 10, a decoder 20 comprising a program decoder 21, a control circuit 30, a bit line selection circuit 40, and a read/write circuit 50.

Memory cell array 10 comprises memory cells arranged in rows connected to corresponding word lines, and columns connected to corresponding bit lines. Each memory cell comprises a nonvolatile memory cell susceptible to electrical programming, reading, and erasure. Additionally, each memory cell typically comprises a charge storage layer such as a floating gate or a charge trap layer.

Control circuit 30 controls memory cell array 10, decoder 20, and read/write circuit 50. Read/write circuit 50 may be configured to store data in memory cell array 10 or read data out from memory cell array 10.

Decoder 20 selects the rows of memory cell array 10 in a write or read operation. Decoder 20 also generates column selection signals YAi and YBi ("i" is an integer) for selecting bit lines in a read or write operation.

Program decoder 21 generates column selection signals YAi and YBi to select bit lines in an erase operation. The erase operation may be divided into a pre-program step, a main erase step, and a post-program step. In one embodiment, program decoder 21 is used as a pre-program decoder for the pre-program step and as a post-program decoder for the post-program step. Program decoder 21 generates column selection signals YAi and YBi to select bit lines in the pre-program step or the post-program step.

During the pre/post-program operation, program decoder 21 generates column selection signals YAi and YBi to select one of a plurality of global bit lines and to select a plurality of local bit lines connected with the selected global bit line, in a predetermined order. During a normal program operation, decoder 20 generates column selection signals YAi and YBi to select one of a plurality of local bit lines and to select a global bit line connected with the selected local bit line.

Bit line selection circuit 40 selects bit lines of memory cell array 10 in response to bit line selection signals YAi and YBi generated by decoder 20. Read/write circuit 50 comprises a write driver, a sense amplifier, an input/output interface, and is configured to write data to selected memory cells or to read data from selected memory cells.

As indicated above, during a pre/post-program operation of an erase process, local bit lines are selected sequentially while a global bit line is selected. During a normal program operation, by contrast, a global bit line and the corresponding local bit lines are selected at the same time. Consequently, in pre/post-program operations where local bit lines are selected in sequence, current consumption is reduced by comparison with normal program operations.

Figure 2:
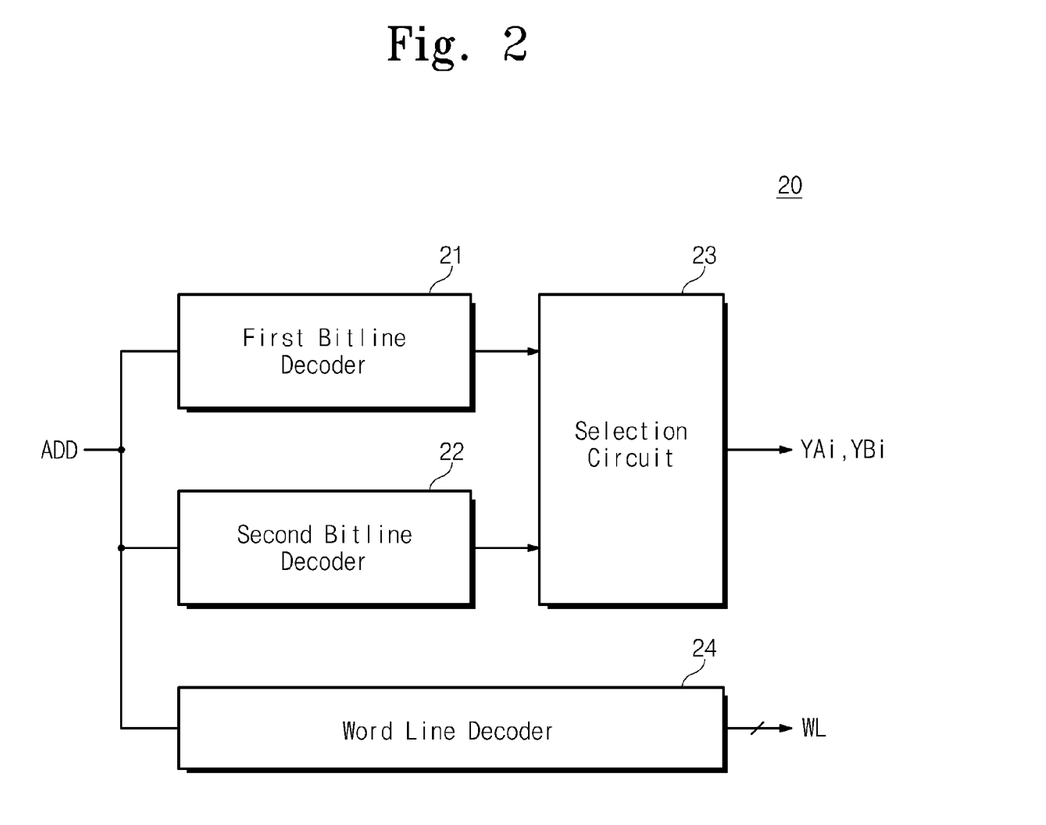
FIG. 2 is a block diagram illustrating an embodiment of a decoder in FIG. 1.

FIG. 2 is a block diagram illustrating an embodiment of decoder 20. In the embodiment of FIG. 2, program decoder 21 of FIG. 1 is implemented as a first bit line decoder 21.

Referring to FIG. 2, decoder 20 comprises first bit line decoder 21, a second bit line decoder 22, a selection circuit 23, and a word line decoder 24. Word line decoder 24 is configured to select and drive word lines in response to an address ADD.

First bit line decoder 21 is enabled by control circuit 30 in response to an erase command and generates bit line selection signals to select bit lines at a pre/post-program operation.

First bit line decoder 21 may generate the column selection signals YAi and YBi to select one of a plurality of global bit lines and to select a plurality of local bit lines, connected with the selected global bit line, in a given order.

Second bit line decoder 22 is enabled by control circuit 30 in response to a normal program command and generates bit line selection signals to select bit lines. Second bit line decoder 22 generates bit line selection signals to select one of a plurality of local bit lines and to select a global bit line connected with the selected local bit line.

Selection circuit 23 selects one of first and second bit line decoders 21 and 22 and transfers an output of the selected bit line decoder to bit line selection circuit 40. The bit line selection signals comprise selection signals YBi for selecting global bit lines and selection signals YAi for selecting local bit lines. Selection circuit 23 selects an output of first bit line decoder 21 in a pre/post program operation and an output of second bit line decoder 22 in a normal program operation, under the control of control circuit 30.

Figure 3:
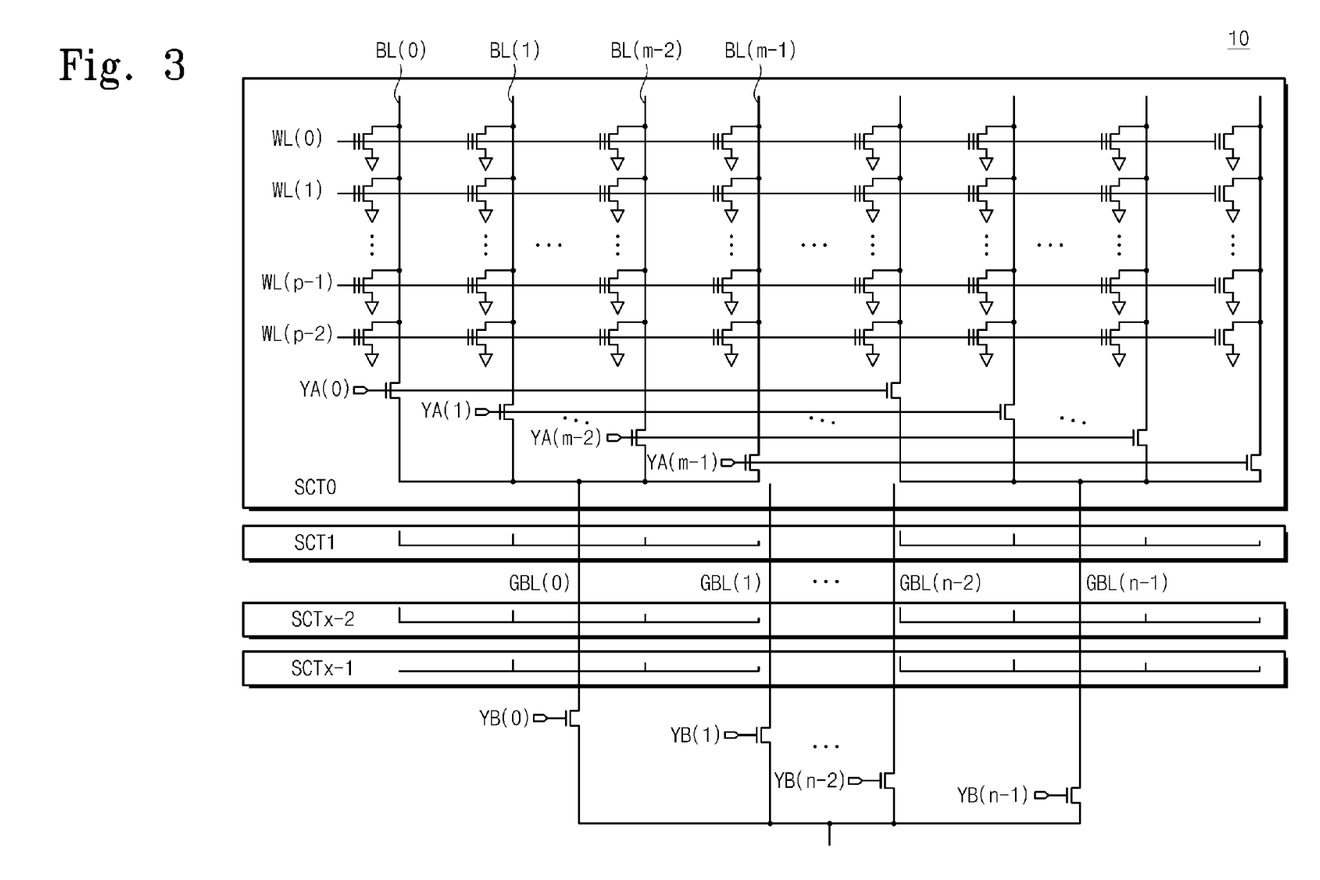
FIG. 3 is a diagram illustrating the structure of a memory cell array according to an embodiment of the inventive concept.

FIG. 3 is a diagram illustrating an embodiment of memory cell array 10 in a NOR flash memory device. In general, a NOR flash memory device comprises a plurality of memory cells formed in a bulk region. A group of memory cells formed in the same bulk region constitutes a sector, which is an erase unit of the NOR flash memory device.

Memory cell array 10 comprises a plurality of sectors SCT0 through SCTx-1. To avoid redundancy, only one sector SCT0 will be described. The other sectors have a similar structure and operation to sector SCT0.

Memory cell array 10 comprises a plurality of global bit lines GBL(0) through GBL(n-1) and a plurality of local bit lines BL(0) through BL(m-1). Each of global bit lines GBL(0) through GBL(n-1) is connected with local bit lines BL(0) through BL(m-1), which are connected with memory cells. That is, one global bit line is connected with a plurality of local bit lines. Memory cells in respective rows may be connected with corresponding word lines WL(0) through WL(p-1).

During a pre/post program operation, when a global bit line (e.g., GBL(0)) is selected, local bit lines (e.g., BL(0) through BL(m-1)) corresponding to the selected global bit line are selected/enabled in a given order. During a normal program/read operation, when a local bit line selection signal (e.g., YA(0)) is enabled, global bit lines each connected with local bit lines selected by the enabled local bit line selection signal YA(0) are selected/enabled in a given order.

Figure 4:
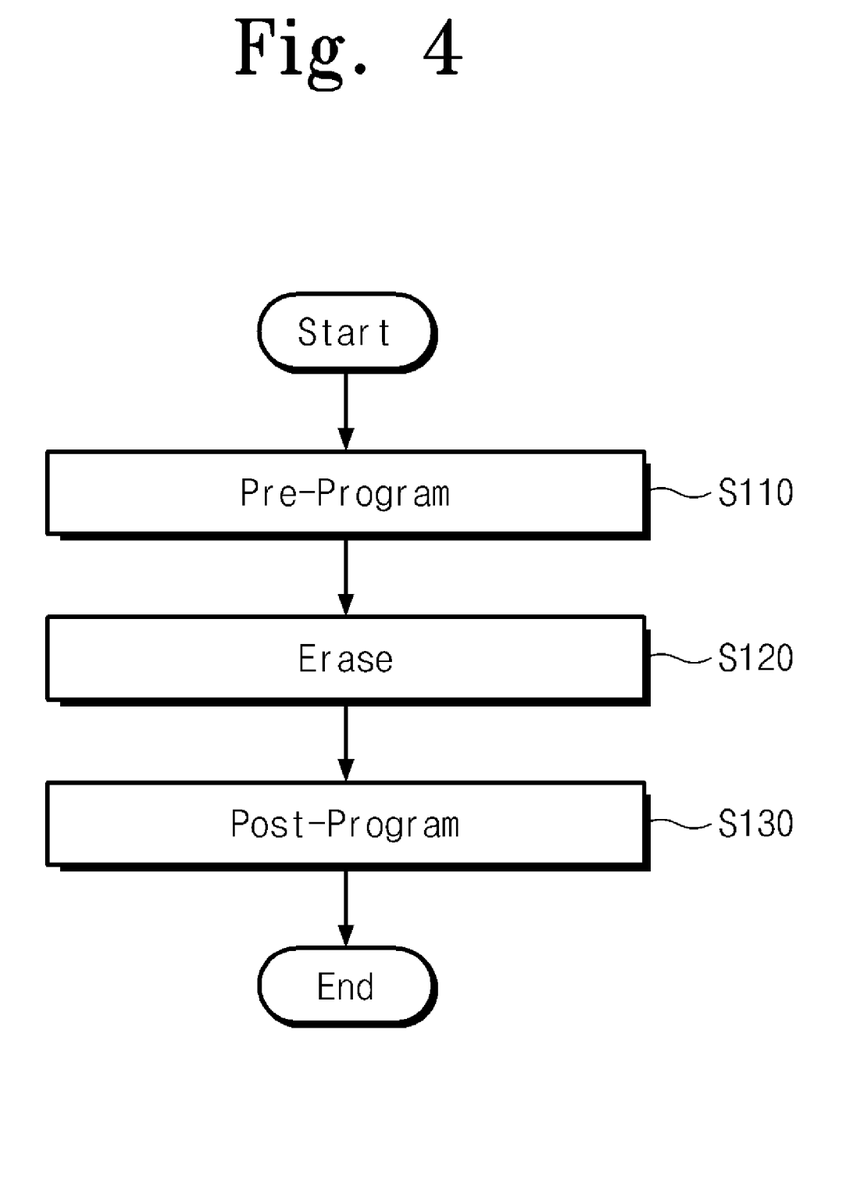
FIG. 4 is a flowchart illustrating an erase operation of a NOR flash memory device according to an embodiment of the inventive concept.

FIG. 4 is a flowchart illustrating an erase operation of a NOR flash memory device according to an embodiment of the inventive concept. The erase operation of FIG. 4 comprises a pre-program step, a main erase step, and a post-program step. In the description of FIG. 4, example method steps are denoted by parentheses (BXXX).

Referring to FIG. 4, the NOR flash memory device first executes a pre-program operation on a sector (B110). The pre-program operation may be executed to prevent memory cells in the sector from being over-erased in a main erase operation.

Next, the NOR flash memory device executes a main erase operation on the sector (B120). The NOR flash memory device performs the main erase operation so that the memory cells in the erased sector all have an erased state.

Finally, the NOR flash memory device executes a post-program operation (B130). The NOR flash memory device executes the post-program operation to adjust the threshold voltages of over-erased memory cells. The post-program operation may be carried out in the same manner as the pre-program operation, except with different bias conditions.

Figure 5:
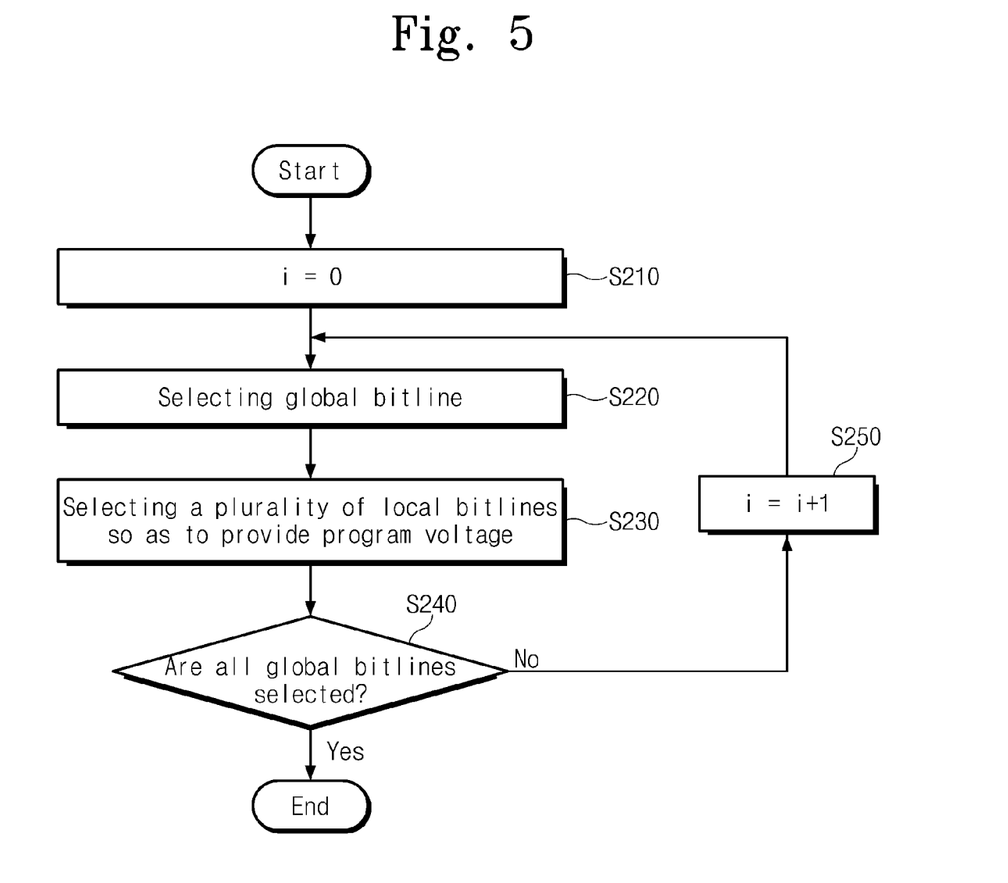
FIG. 5 is a flowchart illustrating a pre/post program operation of a NOR flash memory device according to an embodiment of the inventive concept.
Figure 6:
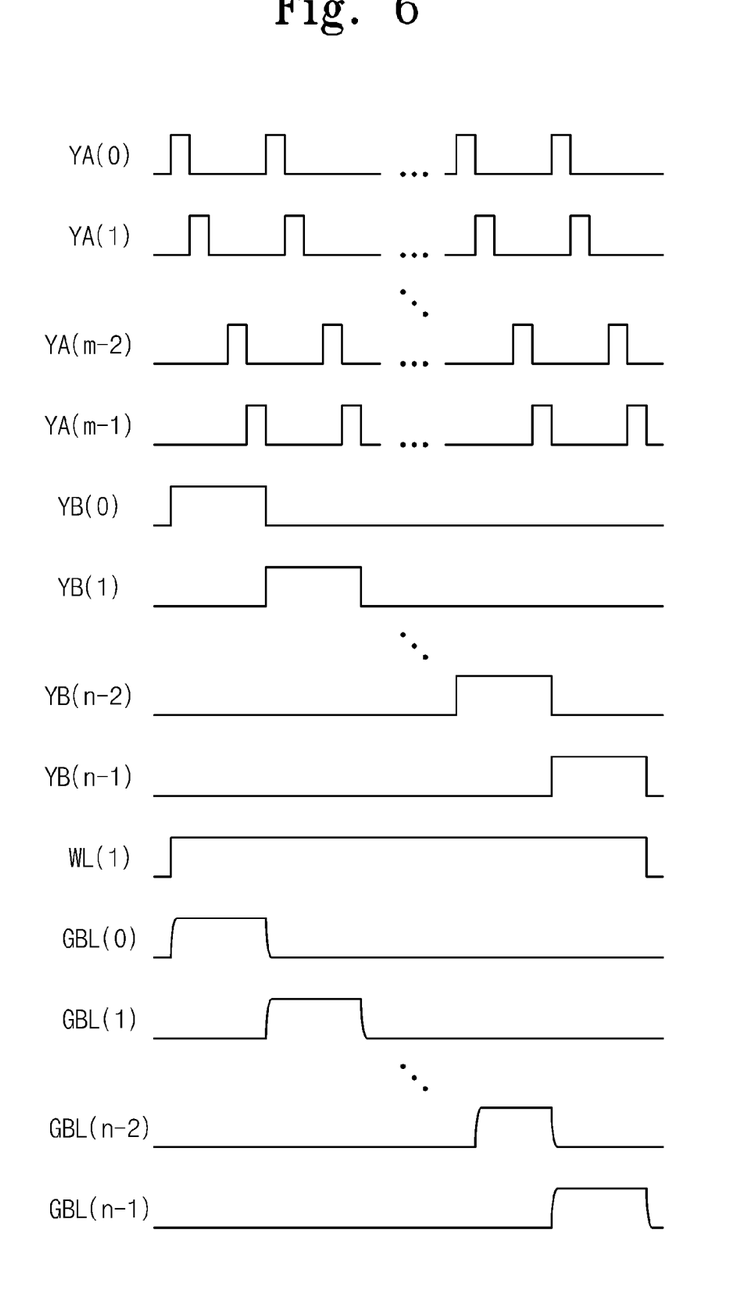
FIG. 6 is a diagram illustrating relationship between bit line selection signals and activation of global bit lines.

FIG. 5 is a flowchart illustrating a pre/post program operation of a NOR flash memory device according to an embodiment of the inventive concept, and FIG. 6 is a waveform diagram illustrating a relationship between bit line selection signals and activation of global bit lines. The operation of FIG. 5 may be used to implement step B100 or B120 of FIG. 4. In the description of FIG. 5, example method steps are denoted by parentheses (SXXX). For simplicity of description, it will be assumed that a word line WL(1) of a NOR flash memory device is selected.

Referring to FIG. 5, an index "i" indicating the number of a selected global bit line is initialized to "0" (S210). Next, bit line selection circuit 40 selects global bit line GBL(0) based on index "i" (S220). Thereafter, local bit lines BL(0) through BL(m-1), which are commonly connected with the selected global bit line GBL(0), are sequentially selected in a predetermined order (S230). In particular, bit line selection signals YA(0) through YA(m-1) are activated in a sequence such as that illustrated in FIG. 6 while a bit line signal YB(0) is enabled. In other words, the local bit lines may be selected sequentially while a global bit line is selected.

As local bit lines BL(0) through BL(m-1) are sequentially selected during activation of global bit line GBL(0), a program voltage is applied to selected memory cells corresponding to the local bit lines and selected word line WL(1). As a result, the selected memory cells are programmed sequentially.

Next, control circuit 30 judges whether all global bit lines have been selected (S240). If all global bit lines have been selected, the pre/post-program operation may terminate. On the other hand, if at least one of the global bit lines is judged not to be selected, "i" is incremented (S250), and flow returns to step S220.

In the above operation, the electrical load on a global bit line may be larger than that on each local bit line, and more current may pass through a global bit line compared with a local bit line. The overall amount of current consumed during pre/post program operations can be reduced, however, by controlling the order of global and local bit line selection.

Figure 7:
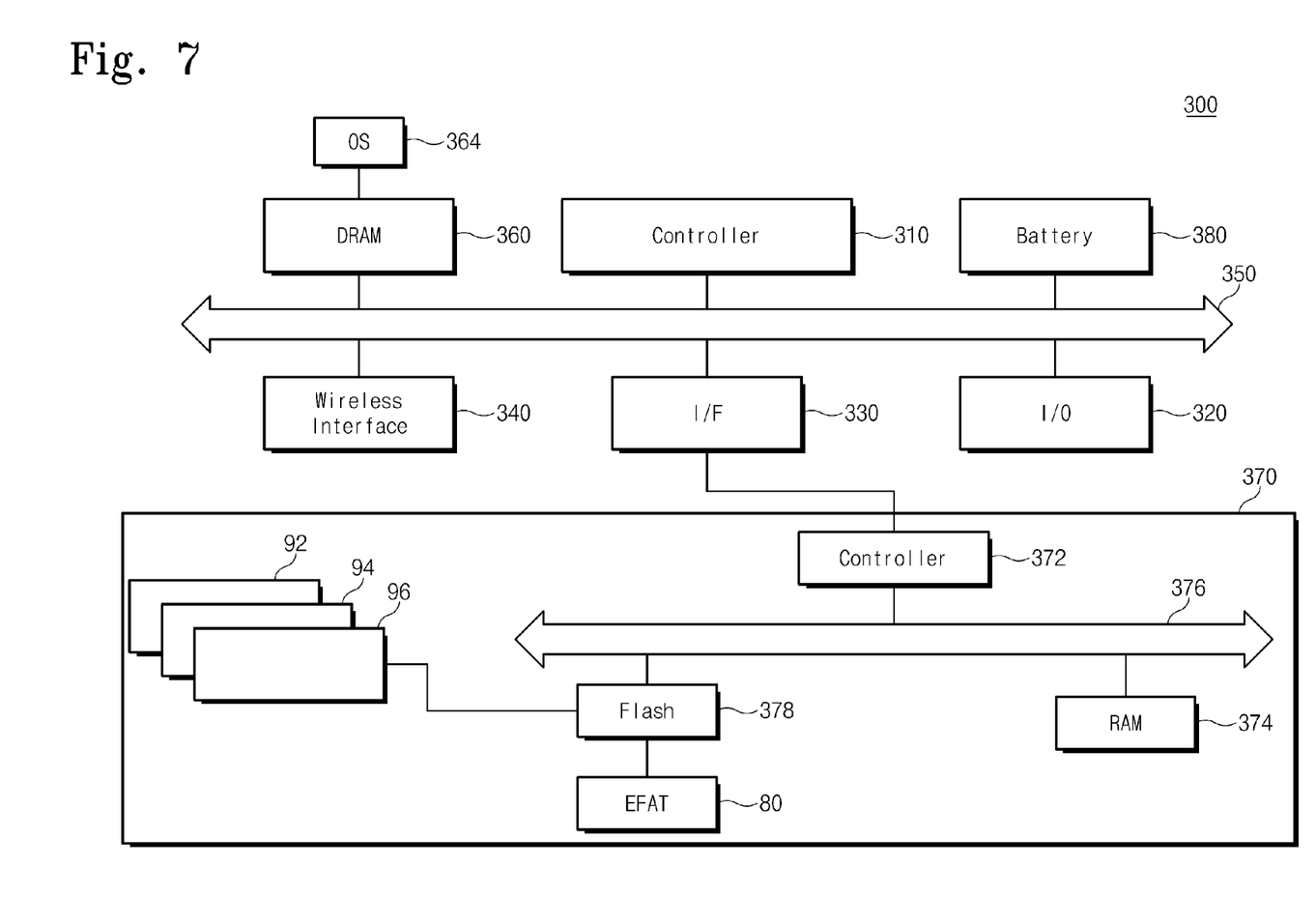
FIG. 7 is a block diagram illustrating a system to which a NOR flash memory device according to an embodiment of the inventive concept is applied.

FIG. 7 is a block diagram illustrating a system 300 incorporating a NOR flash memory device according to an embodiment of the inventive concept.

Referring to FIG. 7, system 300 is a processor-based system comprising a controller 310 communicating via a first bus 350. Controller 310 typically comprises a microcontroller, one or more microprocessors, or a digital signal processor. System 300 may be powered by a battery 380 and may comprise a mobile device such as a mobile terminal.

System 300 comprises a memory 370 connected with first bus 350 via an interface 330. Memory 370 comprises a DRAM 360 connected with first bus 350, a flash memory 378, a RAM 374, and a controller 372.

Flash memory 378 may comprise a NOR flash memory such as that described above in relation to FIGS. 1-6. NOR flash memory 378 stores an Emulated File Allocation Table (EFAT) 80 and software 92, 94, and 96. Upon initialization, EFAT 80 and software 92, 94, and 96 may be executed on RAM 374.

After system 300 is initialized, DRAM 360 may store an operating system 364 such as Microsoft Windows®. Flash memory 378 and the RAM 374 are connected with the controller 372 via a second bus 376.

An input/output device 320 is connected with first bus 350 and may comprise various devices such as a touch screen, a display, a mouse or a keyboard. A wireless interface 340 is connected with first bus 350. Wireless interface 340 may perform a cellular function or a communications function with other devices. For example, wireless interface 340 may comprise a dipole antenna.

Although FIG. 7 illustrates a NOR flash memory device of FIGS. 1-6 within a mobile terminal, such a flash memory device could be included in any of several alternative types of electronic devices.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of operating a NOR flash memory device, comprising:

selecting one of a plurality of global bit lines;

selecting a plurality of local bit lines commonly connected with the selected global bit line in a predetermined sequence to supply a program voltage to memory cells of the NOR flash memory device;

selecting another one of the plurality of global bit lines; and selecting another plurality of local bit lines commonly connected with the another one of the plurality of global bit lines in a predetermined sequence to supply the program voltage to additional memory cells of the NOR flash memory device, wherein the another one of the plurality of global bit lines is identified for selection by incrementing an index within a controller.

2. The method of claim 1, wherein the program voltage is applied to the memory cells via the selected global and local bit lines in a pre-program operation or a post-program operation of an erase process.

3. The method of claim 2, further comprising:

performing the erase process after the pre-program operation or before the post-program operation.

4. The method of claim 1, wherein the program voltage is supplied to the memory cells to prevent the memory cells from being over-erased by an erase operation.

5. A method of erasing a NOR flash memory device, comprising:

performing an erase operation; and performing a program operation before or after the erase operation, wherein the program operation comprises:

selecting one of a plurality of global bit lines, and selecting a plurality of local bit lines commonly connected with the selected global bit line in a predetermined sequence to supply a program voltage to memory cells of the NOR flash memory device; and selecting another one of the plurality of global bit lines; and selecting another plurality of local bit lines commonly connected with the another one of the plurality of global bit lines in a predetermined sequence to supply the program voltage to additional memory cells of the NOR flash memory device, wherein the another one of the plurality of global bit lines is identified for selection by incrementing an index within a controller.

6. The method of claim 5, wherein the program operation is a pre-program operation executed before the erase operation or a post-program operation executed after the erase operation.

7. The method of claim 5, wherein the program operation prevents the memory cells from being over-erased.

8. A NOR flash memory device comprising:
 a memory cell array comprising local bit lines and global bit lines;
 a bit line selection circuit configured to select the local bit lines and the global bit lines in response to local and global bit line selection signals; and
 a decoder configured to generate the local and global bit line selection signals to select local bit lines in a predetermined sequence during an activation of a global bit line in a pre-program or post-program operation,
 wherein the decoder comprises:
 a first bit line decoder configured to generate the global and local bit line selection signals such that one of the global bit lines is selected and local bit lines connected with the selected global bit line are selected sequentially;
 a second bit line decoder configured to generate the global and local bit line selection signals such that one of local bit lines is selected and a global bit line corresponding to the selected local bit line is selected; and
 a selection circuit configured to select one of the first bit line decoder and the second bit line decoder.

9. The NOR flash memory device of claim 8, further comprising:
 a read/write circuit configured to supply a program voltage to memory cells via the selected global and local bit lines.

10. The NOR flash memory device of claim 8, wherein the first bit line decoder is enabled when an erase command is applied to the NOR flash memory device, and the second bit line decoder is enabled when a normal program command is applied to the NOR flash memory device.

11. The NOR flash memory device of claim 10, wherein the first bit line decoder is enabled when one of a pre-program operation and a post-program operation is executed, and the selection circuit selects the first bit line decoder.

12. The NOR flash memory device of claim 8, wherein the pre-program or post-program operation is performed before or after an erase operation to prevent memory cells from being over-erased.

\* \* \* \* \*